(12) United States Patent
Chen et al.

(10) Patent No.: US 7,131,080 B2
(45) Date of Patent: Oct. 31, 2006

(54) SIMULATION MANAGEMENT SYSTEM

(75) Inventors: Thaddeus Chen, Wappingers Falls, NY (US); Zhaoqing Chen, Poughkeepsie, NY (US); Hubert Harrer, Schoenaich (DE); Jan Elizabeth Hoffman, Rochester, MN (US); Susan Marie Karwoski, Rochester, MN (US); Joonsuk Park, Mohegan Lake, NY (US); Edwin Scott Reichmann, Chatfield, MN (US); Stephen Bruce White, Minnesota City, MN (US); John W. Zack, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 428 days.

(21) Appl. No.: 10/651,150

(22) Filed: Aug. 28, 2003

(65) Prior Publication Data
US 2005/0049841 A1    Mar. 3, 2005

(51) Int. Cl.
*G06F 17/50*    (2006.01)

(52) U.S. Cl. .................................. 716/4; 716/5; 716/18
(58) Field of Classification Search ................ 716/4–5, 716/18; 703/14
See application file for complete search history.

(56) References Cited

U.S. PATENT DOCUMENTS

2003/0009658 A1* 1/2003 Chen et al. .................. 713/150
2003/0009730 A1* 1/2003 Chen et al. .................... 716/5

OTHER PUBLICATIONS

Patent Application entitled "Electronic Circuit Design Analysis System," by Thaddeus Chen et al., filed on even date herewith.

* cited by examiner

*Primary Examiner*—Paul Dinh
(74) *Attorney, Agent, or Firm*—Wood, Herron & Evans, LLP

(57) ABSTRACT

A method, apparatus and program product oversee and coordinate the automatic generation, monitoring and submission of package files and other modeling processes to enable focused, flexible and efficient modeling of design performance characteristics.

30 Claims, 5 Drawing Sheets

SIMULATION MANAGEMENT SYSTEM

CROSS-REFERENCE TO RELATED APPLICATION

This application is related to U.S. patent application Ser. No. 10/651,151 filed concurrently herewith on Aug. 28, 2003 by Thaddeus Chen et. al. entitled "Electronic Circuit Design Analysis System". The entire disclosure of that U.S. patent application is incorporated into this application by reference.

FIELD OF THE INVENTION

The present invention relates generally to computer operations and applications, and more particularly, to the automatic design and performance analysis of computer systems.

BACKGROUND OF THE INVENTION

Advances in the field of computer and electronic system design continue to drive and facilitate greater processing efficiencies. Through modeling and other analysis, electronic files containing designs for electronic circuits and computer systems are optimized for use as templates for hardware manufacturing and networking. A typical computer/circuit design file includes text that accounts for numerous electronic hardware components. For example, a file containing a design commonly includes programmatic objects and identifiers descriptive of busses, microchips, expansion cards and other system hardware. A bus generally enables selective communication between a computer processor unit (CPU) and one or more components, such as those mounted on an expansion card. A typical bus, such as a Peripheral Component Interconnect or Industry Standard Architecture bus, may additionally couple to a main system circuit board. Expansion cards are typically thin, rectangular printed circuit boards that have connector pins along one edge that couple to corresponding sockets of the bus. Programmatic objects describing such components within the design file may include delay, routing, voltage, resistance, symbol and/or other parameter data.

In operation, actual components of a circuit cooperate to process electronic signals according to system requirements. More particularly, the components interconnect to generate and communicate electronic signals. Different combinations and configurations of components affect system performance. For example, component layout can impact system timing. System timing regards the arrival of a signal at a given component within a predetermined window of time. Each component visited along the path of a signal introduces varying delay that affects the time required for the signal to reach a destination component. Thus, successful timing requires coordination with other signals and signal paths to ensure coordinated system processing. Failure to achieve desired timing can result in processing delays, error and failure. For instance, a system function that conjunctively processes multiple signals cannot complete its processing until the last of the signals arrives. Thus, the function can be unduly delayed or altogether frustrated should an unacceptable amount of time lapse while waiting for the last of the signals to arrive. For example, delays may cause race conditions, where a process may shutdown altogether in response to a late signal.

Another performance factor affected by system design is noise. Noise is characterized as static or interference introduced as the signal travels through system components and connections. As such, the electrical characteristics of the signal change as it propagates through a system. For instance, square wave characteristics of an input signal may become less distinct due to loss dispersion encountered in a system. While some tolerance of noise is typically built into a system design specification, unacceptable noise levels can severely impact signal clarity and system performance. For example, data may become corrupted, e.g., a binary "1" may register as a "0."

Production of a hardware system represents a substantial investment of material, manpower and other economic resources. Consequently, it is advantageous to verify design integrity prior to committing it to hardware. More particularly, it is desirable to predict or otherwise analyze performance characteristics of a design prior to implementation. To this end, simulation programs, or engines, have been developed to model performance of the programmatic objects of a design. Such modeling practices help to assure conformity with system needs.

Processes associated with modeling, however, represent a substantial investment of manpower, as a single modeling effort may require days of preparation, constant monitoring and technical attention. For instance, an analyst must attempt to create a data file that encapsulates critical aspects of a design, yet is small enough to be processed without overwhelming the memory and processing resources of a system. Furthermore, the analyst must ensure that the data file, as well all programs required to process the file, are accounted for, available and recalled at the proper sequences, or an entire simulation may be compromised. In that vein, the analyst must also ensure that an adequate amount of processing power and memory is available to accommodate a modeling process. Failure to provide such files and resources on a timely basis can unduly delay and frustrate a modeling process. For example, an analyst may painstakingly manage a modeling process for weeks before realizing that the absence of a missing file or adequate memory will require the entire modeling process to be re-accomplished. Moreover and as may be inferred from above, modeling requires many dedicated hours from the most highly skilled and experienced analysts to properly setup, coordinate, monitor and otherwise execute a simulation. Such demands on personnel complicate training, limit the number of those available who can execute a modeling scenario, and draw the most skilled personnel away from other projects that could otherwise benefit from their expertise.

Consequently, and for in part the above delineated reasons, there exists a need for an improved manner of managing a circuit system simulation.

SUMMARY OF THE INVENTION

The present invention provides a flexible, automated and otherwise improved apparatus, method and program product for managing and automating a simulation useful in analyzing performance of an electronic circuit in a manner that addresses the above-identified problems of existing systems. In one respect, embodiments of the present invention may automatically generate and/or access, as well as monitor and otherwise manage, data and programs required for the simulation. For these purposes, data consistent with the invention may include logically-linked package files. The package files comprise abstracted data that is small enough to allow reasonable processing, but still sufficient to model a performance characteristic of an electrical design. The package files and other applications are automatically and selectively included within a given simulation. To this end, a profile comprising user input flexibly calls only those applications required in the simulation, further reducing processing and memory requirements.

Data generation, retrieval, and monitoring processes consistent with the present invention may be automated, realizing even greater efficiencies and accountability, while reducing analyst workload and required expertise. For instance, an embodiment in accordance with the present invention may coordinate sending batch jobs, mitigating the possibility of race conditions. Another program consistent with the principles of the invention may monitor a simulation in parallel for a status condition, the detection of which sets in motion a remedial action designed to address the condition. Automated pre-run checks may reduce incidents where a simulation is begun with faulty or missing data/resources, and a searchable log file may be automatically maintained for accountability and analysis purposes. The flexible embodiments of the present invention may be altered or interrupted during the course of a simulation in response to user input, which may be converted automatically into a profile. Where desired, post processes in accordance with the present invention may automatically free up file space and other memory after a simulation's completion.

By virtue of the foregoing there is thus provided an improved simulation management mechanism that addresses shortcomings of conventional techniques. These and other objects and advantages of the present invention shall be made apparent in the accompanying drawings and the description thereof.

BRIEF DESCRIPTION OF THE DRAWINGS

The accompanying drawings, which are incorporated in and constitute a part of this specification, illustrate an embodiment of the invention and, together with a general description of the invention given above, and the detailed description of the embodiment given below, serve to explain the principles of the invention.

DETAILED DESCRIPTION OF DRAWINGS

Figure 1:
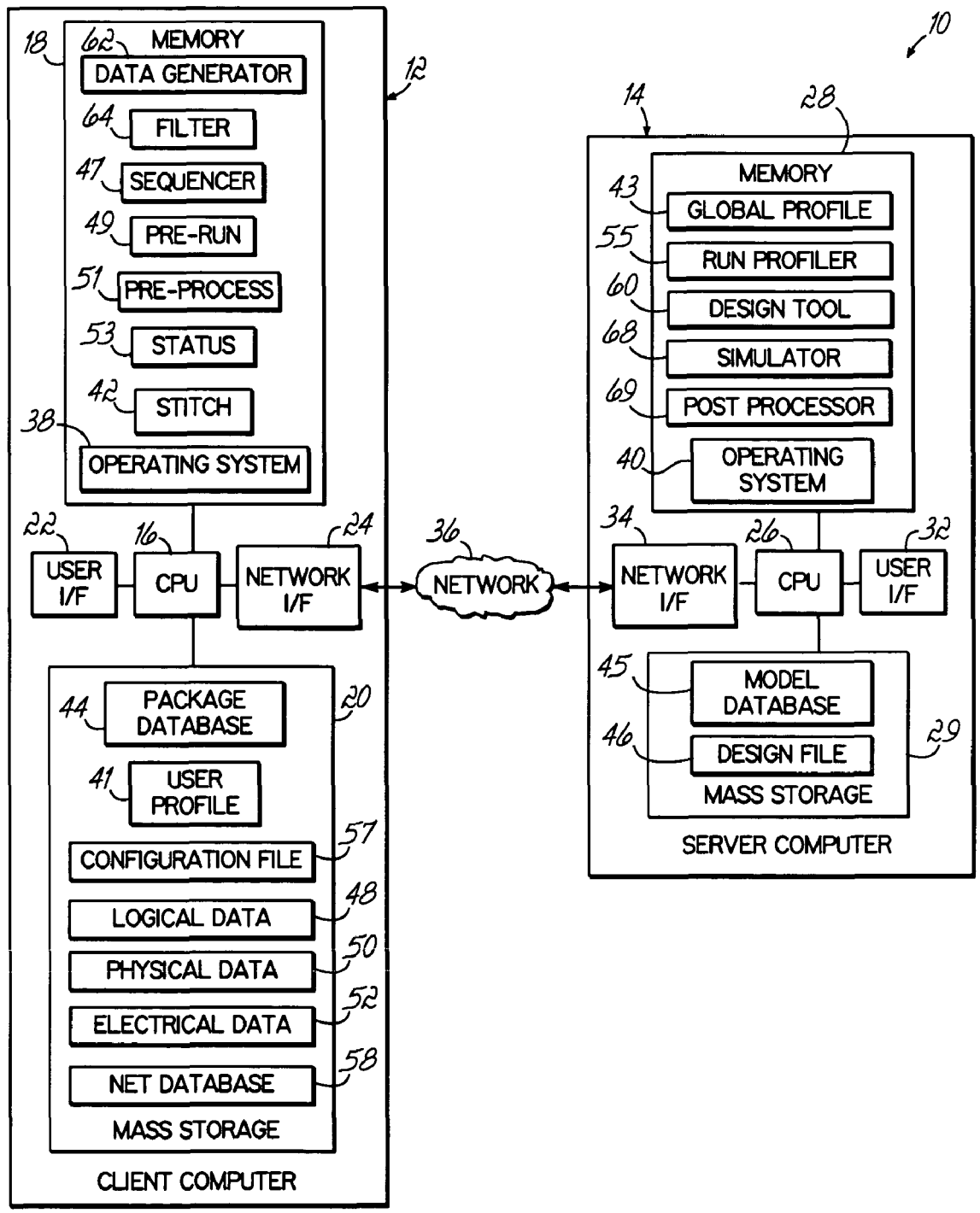
FIG. 1 is a block diagram of a client-server computer system having software consistent with the invention.

With reference generally to the embodiment of FIG. 1, there is shown a system 10 configured to automatically and flexibly manage analysis of an electronic design file. In so doing, the system 10 may, among other functions, initiate, oversee and automate simulations useful in determining a desired performance parameter, to include timing and noise characteristics. In one respect, the processes of the system 10 may selectively and automatically generate and combine appropriate package files needed to analyze a desired performance parameter. For purposes of this specification, a package file may include code descriptive of and/or relating to a portion of an electrical design to be analyzed. For instance, a package file may comprise text that programmatically defines a component, or group of components and connections that affect a path traveled by a signal for a given application.

According to an embodiment that is consistent with the invention, selected package files may be automatically generated, retrieved and logically linked (stitched) using reference connections defined within each package file to form a composite, net file. An exemplary reference connection may include geometric coordinates of a pin connection used to interconnect components. As disclosed more particularly in the U.S. Patent Application entitled "Electronic Circuit Simulation System," which is submitted concurrently by the same applicants and hereby incorporated by reference in its entirety, a package file comprises data abstracted from a design file. The package files may be logically-linked to efficiently model critical functionality of the a circuit design file. The amount of abstracted data is small enough to allow reasonable processing, but is still sufficient to model a desired performance characteristic.

Despite the processing efficiencies of package techniques, it has been found that modeling can still be a painstaking, error prone and meticulous process. For example, while the relatively smaller sizes of the package files greatly reduce the volume of data to be processed, a typical modeling session may still require analysis of over 20,000 nets. Furthermore, modeling still represents a substantial investment of manpower, as a single modeling effort may require hours to days of constant monitoring. For instance and as discussed herein, an analyst must ensure that required programs and files are accounted for and recalled at the proper sequences, or an entire simulation may be compromised. Analysts must furthermore ensure that an adequate amount of processing power and memory is available to accommodate a modeling process. Failure to provide such files and resources on a timely basis can unduly delay and frustrate a modeling process.

To address these challenges, generation of the net files and other applications are constantly monitored and coordinated by the processes of the present invention. For purposes of this specification, an application, or modeling application, may comprise one or more of any computer resources, to include programs, processors, data, memory and/or hardware ports, among others. Such monitoring allows potential problems to be addressed preemptively. Processes consistent with the invention further automate retrieval, coordination and submission of data and programs for execution.

FIG. 1 illustrates a system 10 implemented as a client-server based computer system. System 10 includes at least one apparatus, e.g., one or more client computers 12 and one or more server computers 14. For the purposes of the invention, each computer 12, 14 may represent practically any type of computer, computer system or other programmable electronic device capable of functioning as a client and/or server in a client-server environment. Moreover, each computer 12, 14 may be implemented using one or more networked computers, e.g., in a cluster or other distributed computing system. Moreover, as is common in many client-server systems, multiple client computers 12 will typically be interfaced with a given server computer 14. While more capable computer systems may present advantages in certain embodiments consistent with the principles of the present invention, a suitable server 14 for purposes of this specification may comprise any device configured to receive and process an electronic message transmitted from the client computer 12.

Client computer 12 typically includes a central processing unit 16 including at least one microprocessor coupled to a memory 18, which may represent the random access memory (RAM) devices comprising the main storage of computer 12, as well as any supplemental levels of memory, e.g., cache memories, non-volatile or backup memories (e.g., programmable or flash memories), read-only memories, etc. "Memory" for purposes of this entire specification should be further be construed to include file space, such as that associated with a hard drive. Examples of stored programs stored within memory 18 may include a stitching program 42 configured to retrieve and link appropriate package files according to a system configuration file 57. As described below in greater detail, another program 62 may process a system design file 46 to derive physical, logical and electrical files 48, 50 and 52, respectively. A design tool 60, such as a computer aided design (CAD) program, may be used to generate the design file 46. A filter program 64 of the system 10 may determine what information should will be included within a package per operating and user specifications. A status program 53 may include instructions configured to give realtime updates to a user and/or log. A sequencer 47 may coordinate processing of dependent jobs, while a pre-run check program 49 verifies that needed resources are available for a given simulation. A pre-process program initiates generation of needed resources, such as package files 44. In addition, memory 18 may be considered to include memory storage physically located elsewhere in computer 12, e.g., any cache memory in a processor in CPU 16, as well as any storage capacity used as a virtual memory, e.g., as stored on a mass storage device 20 or on another computer coupled to computer 12.

Computer 12 also typically receives a number of inputs and outputs for communicating information externally. For interface with a user or operator, computer 12 typically includes a user interface 22 incorporating one or more user input devices (e.g., a keyboard, a mouse, a trackball, a joystick, a touchpad, and/or a microphone, among others) and a display (e.g., a CRT monitor, an LCD display panel, and/or a speaker, among others). Otherwise, user input may be received via another computer or terminal.

For additional storage, computer 12 may also include one or more mass storage devices 20, e.g., a floppy or other removable disk drive, a hard disk drive, a direct access storage device (DASD), an optical drive (e.g., a CD drive, a DVD drive, etc.), and/or a tape drive, among others. An exemplary mass storage may include a database 44 that contains package files generated from stored logical, physical and electrical files 48, 50 and 52, respectively. As discussed in greater detail below, the system 10 may derive such files 48, 50 and 52 from a system design file 46, shown at server computer 14 for exemplary purposes. Still other examples of storage 20 may include a net database 58 containing nets for recall and/or combination with other nets as needed. Electrical model information may be retrieved from another database 45 in response to instructions from a processed electrical file 52. Where advantageous, the electrical data/file 52 may include electrical model information.

The database 44 may further include a user profile 41 that contains paths to desired executables. This profile 41 is similar to a global profile 43, which comprises default or administratively established paths. The embodiment of FIG. 1 additionally includes a run profiler 55 for facilitating generation and processing of profiles. In one embodiment, the profiler 55 may include code for efficiently calling applications. One of skill in the art will recognize that the inclusion and distribution of the databases, files and other stored data as between the client and server computers may be altered substantially while still conforming with the principles of the present invention.

Furthermore, computer 12 may include an interface 24 with one or more networks (e.g., a LAN, a WAN, a wireless network, and/or the Internet, among others) to permit the communication of information with other computers and electronic devices. It should be appreciated that computer 12 typically includes suitable analog and/or digital interfaces between CPU 16 and each of components 18, 20, 22 and 24 as is well known in the art.

Similar to computer 12, computer 14 includes a CPU 26, memory 28, mass storage 29, user interface 32 and network interface 34. However, given the nature of computers 12 and 14 as client and server, in many instances computer 14 will be implemented using a multi-user computer such as a server computer, a midrange computer, a mainframe, etc., while computer 12 will be implemented using a desktop or other single-user computer. As a result, the specifications of the CPU's, memories, mass storage, user interfaces and network interfaces will typically vary between computers 12 and 14. However, one skilled in the art will appreciate that other hardware environments are contemplated within the context of the invention.

Computers 12, 14 are generally interfaced with one another via a network 36, which may be public and/or private, wired and/or wireless, local and/or wide-area, etc. Moreover, network 36 may represent multiple, interconnected networks. In the illustrated embodiment, for example, network 36 may include the Internet.

Each computer 12, 14 operates under the control of an operating system 38, 40 and executes or otherwise relies upon various computer software applications, components, programs, objects, modules, data structures, etc. Moreover, various applications, components, programs, objects, modules, etc. may also execute on one or more processors in another computer coupled to computer 12, 14 via a network, e.g., in a distributed or client-server computing environment, whereby the processing required to implement the functions of a computer program may be allocated to multiple computers over a network.

In general, the routines executed to implement the embodiments of the invention, whether implemented as part of an operating system or a specific application, component, program, object, module or sequence of instructions, or even a subset thereof, will be referred to herein as "computer program code," or simply "program code." Program code typically comprises one or more instructions that are resident at various times in various memory and storage devices in a computer, and that, when read and executed by one or more processors in a computer, cause that computer to perform the steps necessary to execute steps or elements embodying the various aspects of the invention. For instance, the embodiment of FIG. 1 includes stitching program code 42 configured to selectively link packages into net files as appropriate per an analysis session. Complementary program code may reside on the server 14 side, but one of skill in the art should appreciate that embodiments consistent with the principles of the present invention may nonetheless use program code resident at only one, or any number of locations.

Moreover, while the invention has and hereinafter will be described in the context of fully functioning computers and computer systems, those skilled in the art will appreciate that the various embodiments of the invention are capable of being distributed as a program product in a variety of forms, and that the invention applies equally regardless of the particular type of signal bearing media used to actually carry out the distribution. Examples of signal bearing media include but are not limited to recordable type media such as volatile and non-volatile memory devices, floppy and other removable disks, hard disk drives, magnetic tape, optical disks (e.g., CD-ROMs, DVDs, etc.), among others, and transmission type media such as digital and analog communication links.

In addition, various program code described hereinafter may be identified based upon the application within which it is implemented in a specific embodiment of the invention. However, it should be appreciated that any particular program nomenclature that follows is used merely for convenience, and thus the invention should not be limited to use solely in any specific application identified and/or implied by such nomenclature. Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the invention is not limited to the specific organization and allocation of program functionality described herein.

Those skilled in the art will recognize that the exemplary environment illustrated in FIG. 1 is not intended to limit the present invention. Indeed, those skilled in the art will recognize that other alternative hardware and/or software environments may be used without departing from the scope of the invention.

Figure 2:
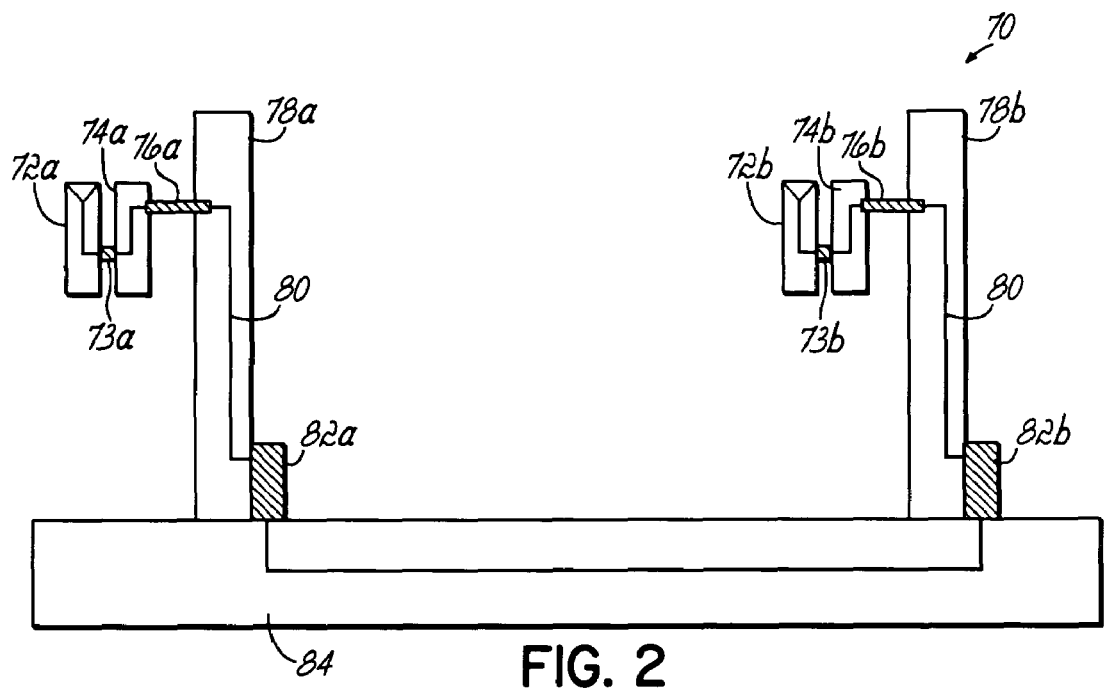
FIG. 2 is a block diagram of an electrical circuit design suited for analysis using the computer system of FIG. 1.

FIG. 2 shows an exemplary electrical circuit design 70 for which a package 44 or net file 58 of FIG. 1 may be generated in accordance with the principles of the present invention. The circuit 70 is shown for illustrative purposes only, and one of skill in the art will appreciate that package and/or net files consistent with the invention may be generated according to hardware environments that comprise much smaller or larger hardware entities. Suitable hardware applications may thus include, for example, the networked computer system 10 of FIG. 1 and/or a portion of a single microchip/driver 72a of FIG. 2, to include transistors on the chip 72a.

As shown in FIG. 2, the circuit 70 designated for analysis includes hardware positioned along a signal path from a designated driver 72a to a designated receiver 72b. The driver 72a comprises the point of origination of a signal for purposes of a net modeling scenario, and the receiver 72b represents the point of the signal's arrival at its destination within the defined net file. As such, a net and/or package may comprise any hardware and/or software positioned along a path between a driver and a receiver, A net may further comprise multiple packages that each define a portion of a computer system. One of skill in the art will appreciate that typical package files are advantageously designed to be of relatively manageable sizes. The driver 72a of FIG. 2 includes a microchip housed within a module 74a. A typical microchip includes components formed in silicon, such as capacitors, resistors, inductors, connectors and switches. While only one microchip is shown directly connected to the module 74a, one of skill in the art will nonetheless appreciate that a suitable module may alternatively mount multiple microchips.

The driver 72a connects to the module 74a via a pin connector 73a formed from silicon substrate, such as a Controlled Collapse Chip or flip-chip solder-bump connection as is known in the field. Similarly, the module 74a attaches to an expansion card 78a via another connector 76a. The expansion card 78a includes a thin, rectangular printed circuit board that has electrical components such as capacitors, inductors and resistors. The expansion card 78a further includes connector pins (not shown) along one edge that couple to corresponding sockets (not shown) of a main system circuit board 84 and/or a bus 82a. The bus 82a generally enables selective communication between the microchip 72a and (a processor communicating with) the main system board 84. A signal may travel through each of these and other components of the electrical circuit design 70 along a path to the receiver 72b defined by line 80. Of note, the microchip/receiver 72b attaches to a module 74b and the rest of the electrical circuit design 70 (as programmatically defined within the net file) by connector pin 73b. As discussed herein, such pins 73a&b may provide useful reference connections for purposes of stitching packages and other nets. As such, one of skill in the art should appreciate that the electrical circuit design 70 as defined in a net file may include multiple, stitched package files. Accordingly, the electrical circuit design 70 may include many more reference connectors as needed.

Figure 3:
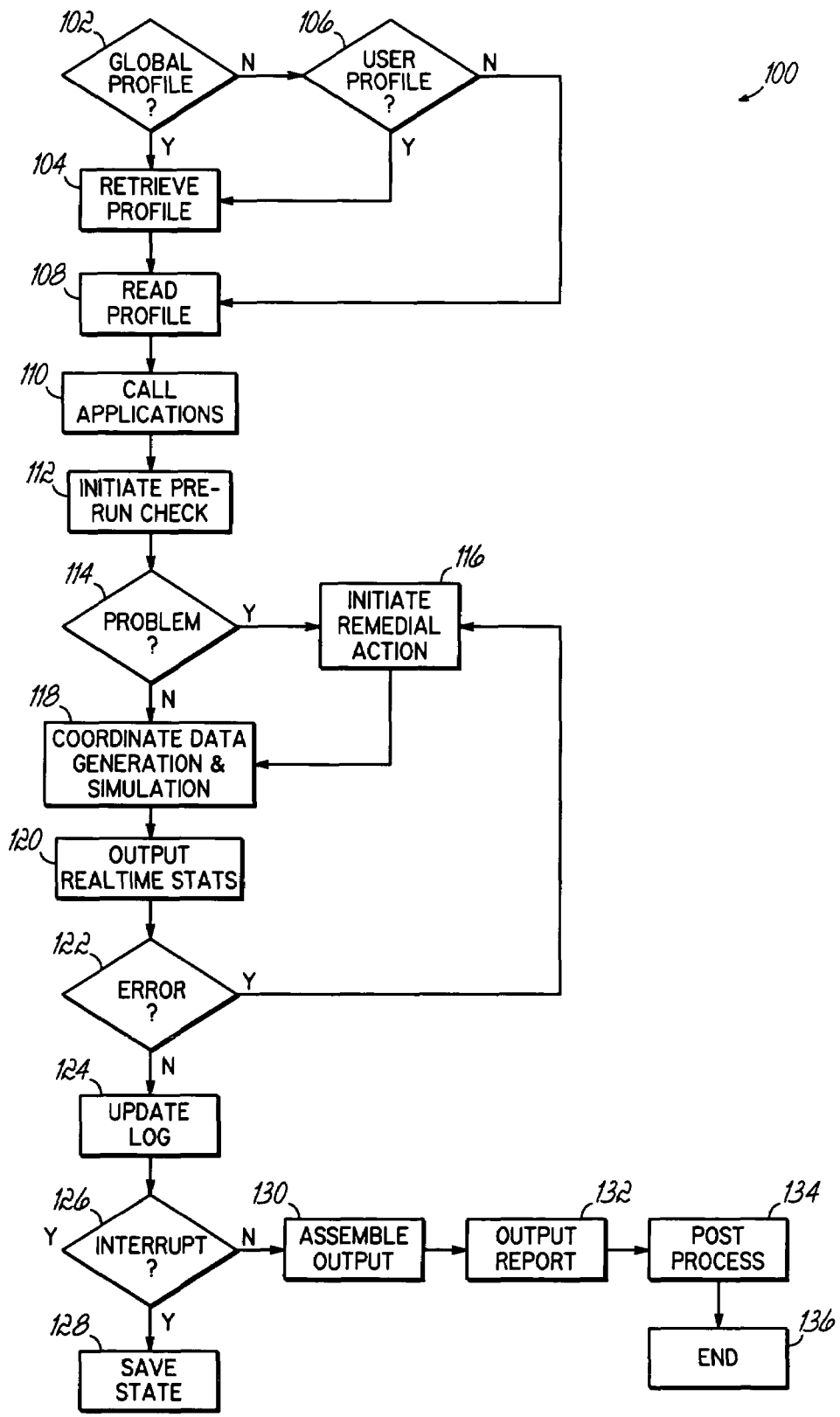
FIG. 3 is a flowchart having method steps for automatically managing analysis of an electrical circuit design consistent with the invention and suited for execution within the system of FIG. 1.

FIG. 3 is a flowchart 100 having process steps suitable for execution within the computer system 10 of FIG. 1. More particularly, the exemplary steps 102–136 automatically manage and execute a simulation of a signal traveling in an electrical circuit 70 in accordance with the principles of the present invention. That is, the exemplary steps 102–136 of FIG. 3 are suited to automatically initiate, oversee and automate simulations useful in determining a desired performance parameter, to include timing and noise characteristics.

Blocks 102–108 of FIG. 3 regard input from a user and/or administrator that specifies desired performance aspects of the simulation. The user input, or profile data, may comprise script files that contain paths of execution or instructions. The execution paths/instructions may designate a program, data source or other simulation application, such as those shown in the exemplary system 10 of FIG. 1. The profile data thus provides users with a mechanism to flexibly tailor and specify resources to be used and/or modeled within a given simulation. Where desired, a user-friendly interface may aid the user in converting user input into properly formatted script. For example, such an interface may include a drag-and-drop type interface and/or a pull-down menu option.

Turning more particularly blocks 102–108 of FIG. 3, the system 10 may determine at block 102 if one or more global profiles 43 exists. A global profile 43 may comprise paths to or data indicative of executables, program and simulation data. As such, the global profile 43 may further comprise default settings that are retrieved at block 104. Where so desired, the user may select from one or more such global profiles 43. For example, the execution path of one global profile may specify the location of verified or shared data, while an analogous path of another profile may be configured to call SANBOX or other working data. The same or another global profile may contain paths to local and/or remote sources, per user or administrator preferences. The profile at block 102 thus presents a platform from which desired data sources may be specified.

Similarly, the system 10 may retrieve and select one or more user profiles 41 at block 104, if one or more such user profiles 41 are present and selected at block 106. User profiles 41 may comprise user specified executable paths, and may preempt conflicting global profile instructions. In a specific example, the user profile 41, like a global profile 43, may stipulate whether a particular function of a simulation should execute locally or remotely. A remote application may be appropriate where multiple simulation functions are to be monitored by a user in parallel. Conversely, a local execution of a function may facilitate analysis where serial execution of simulation functions are involved As discussed, the user specified paths of the user profile 41 will typically preempt those of a selected global profile 43. Thus, an embodiment of the present invention may allow a user to flexibly tailor a simulation according to their own preferences.

In any case, the system 10 may read an applicable profile(s) at block 108 and call programs, data and other applications associated with the profile at block 110. Among others, such applications may include the exemplary software features discussed above in connection with FIG. 1. For example, the system 10 may specify logical and physical data used in a previous simulation. Such a scenario may have particular application where a user is optimizing system parameters using some repeatable data.

At block 112, the system 10 may execute a pre-run check to verify that all or certain of the applications specified in the profile at block 108 have been successfully retrieved. For instance, the system 10 may determine whether adequate processing power and memory space is available. Another pre-run check may include confirming that specified electrical model and program files are accessible. A pre-run check may, but typically does not appraise or copiously evaluate the called applications. As such, the pre-run check can be accomplished relatively quickly.

In addition to its speed, the pre-run check of block 112 may mitigate instances where the absence of a needed application is discovered too late in a simulation process to recover lost time and other resources. In the absence of such a feature, for instance, a simulation could progress for sixteen hours before ending prematurely as a result of running out of temporary memory space. Instead, and by virtue of the embodiment shown in FIG. 3, the system may determine at block 112 what amount of file space or other memory will be required for the application of the above example, and if that amount of memory is actually available at block 114. If not, then a user may be notified at block 116 so sufficient memory may be allocated, for instance, prior to continuing with the application. Where appropriate, the remedial action of block 116 may include other automated features, such as retrying access to a I/O port that failed on a first attempt. In any case, one of skill in the art should appreciate that a suitable remedial action may include any step taken in response to a determined status. The system 10 thus contributes additional monitoring and management capabilities at block 112.

Once the pre-run check has been accomplished at block 112 of FIG. 3, the system 10 may begin actual simulation processes at block 118. While discussed below in greater detail in connection with FIG. 4, such processes for purposes of the flowchart 100 of FIG. 3 may include coordinating and otherwise managing data generation and modeling for a simulation. That is, the processes consistent with the invention may manage modeling of the travel of a signal from a driver to a receiver. Such simulations concerning the net file may be accomplished according to any known modeling technique. Thus, features of the present invention may apply to and enhance conventional modeling practices and mechanisms.

A monitoring component of the management processes consistent with the invention may include the generation and output of realtime statistics at block 120. Exemplary realtime statistics may comprise messages or other data configured to apprize a user of ongoing simulation processes. While some realtime statistics may be routine or confirming in nature, others may indicate a need for direct user intervention. For instance, a realtime statistic may notify a user that an error has occurred at block 122. An error message, for example, may inform the user that a needed job is idle or otherwise inaccessible. Such notification at block 122 may enable the user to correct or otherwise account for a detected anomaly at block 116 of FIG. 3. That is, a user may attempt to enable memory, processors, executable paths, permissions or other resources needed to address a detected error as the simulation processes continue to the extent possible.

Other and/or the same statistics of an embodiment that is consistent with the principles of the present invention may be automatically recorded in a system log or other memory at block 124. As with the realtime statistics discussed in connection with block 122, the type and frequency of statistics stored in the log at block 124 may be customized by a user. Such tailored storage may assist the user in precisely and efficiently evaluating simulation processes per application specifications. Where desired, the log file may comprise a searchable file compiled and consolidated from a number of other log files.

At any time during the processes of the present invention, a user or the system 10 may pause, or interrupt, system activities. As with all other processes described herein, the interrupted processes at block 126 may be selectively affected without interrupting other processes that the user may wish to continue. Additionally, as with all other steps of the flowcharts of FIGS. 3–6, step 124 may be augmented, omitted or rearranged in relation to other steps while remaining consistent with the underlying principles of the present invention. As represented at block 128 of FIG. 3, the state of an interrupted process may be saved in a register or other memory. Saving the state at block 128 permits the process to be recalled and resumed at the same point at which it was interrupted.

The system 10 may automatically assemble desired output at block 130. Such output may include the results of multiple, parallel processes that may be selectively assembled at block 130 for the purpose of outputting a report at block 132. A typical report output at block 132 may include data relating to noise and/or timing information. That is, exemplary output of a simulation may include one or more waveforms at block 132. The program code 69 may be configured to then determine a desired characteristic from the waveform. For instance, the program code 69 may determine noise characteristics and/or timing information at block 132 from an analog waveform. Noise determinations may regard predicted static, signal interference or loss dispersion encountered as a signal travels through design components and connections. Timing regards the arrival of a signal at a given component within a predetermined window of time. While such performance factors may be of particular interest to system designers of one application, one of skill in the art will appreciate that other modeling characteristics may alternatively and/or additionally be output by analyzing waveforms output at block 132 in accordance with the principles of the present invention. In any case, reports reflecting such analysis may be stored at block 132 for future use, to include comparison and combination with other reports.

Prior to the exemplary simulation management processes of the flowchart 100 concluding at block 136, the system 10 may conduct post processing functions at block 134. Post processing typically includes cleanup features useful in freeing up file space and other memory needed for other applications. For instance, a user profile 41 may instruct the system 10 to delete all debugging files associated with a given simulation at block 134 in response to a successful modeling sequence.

Figure 4:
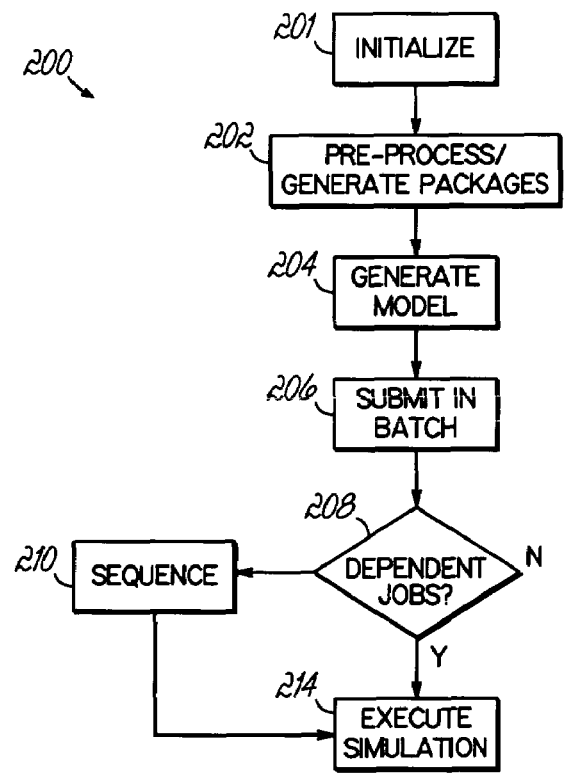
FIG. 4 is a flowchart having method steps consistent with the invention and having particular application within the context of the data generation and coordination processes of FIG. 3.

The flowchart 200 of FIG. 4 expands further upon processes associated with block 118 of FIG. 3. That is, the exemplary process steps 201–214 are directed to monitoring the processing and generation of data used in a simulation management sequence in accordance with the principles of the present invention. Such generation/coordination processes are initialized at block 201 of FIG. 4. As discussed above, such initialization may include or be preceded by retrieving applications and executables specified in a profile script.

At block 202 of FIG. 4, the system 10 may conduct pre-processing functions, including generating package and other modeling data. While pre-processing and package generation is discussed below in detail in connection with FIG. 5, the pre-processing feature of the embodiment shown in block 202 of FIG. 4 typically includes generation and processing of data that can be accomplished prior to assembling a model at block 204. As discussed herein, only those processes required for a given application need be activated/generated in accordance with the principles of the present invention. For example, package files do not need to be generated or recalled for parts of the circuit 70 that do not impact a given simulation application. Moreover, partially generated data may be utilized by the system 10 where possible to quicken analysis.

The system 10 may use the package files generated at block 202 to generate a model at block 204. While generation of the model is the subject of FIG. 6 as discussed below, for purposes of block 204 of FIG. 4, the step may generally include the automatic stitching, formatting and other combination processes associated with assembling data necessary for a simulation sequence.

After such assembly has been accomplished at block 204, the system 10 may automatically submit applications for execution at block 206. The submission may be in batch, where desired. As such, submission of the applications may be coordinated by the sequencer program 47. The sequencer program 47 may be utilized at block 210 where the presence of dependent jobs is determined at block 208. A dependent job includes an application that is affected by the prior or parallel processing of another application. For instance, one application may have to complete before another can be processed. The sequencer program 47 may thus manage the sequence of submissions for jobs that require coordinated timing. One of skill in the art will appreciate that the sequencer program 47 of another embodiment that is consistent with the invention may additionally function to submit all applications for execution, even where dependency is not an issue. The system 10 at block 214 of FIG. 4 may then call any remaining scripts and/or complete execution of the simulation.

Figure 5:
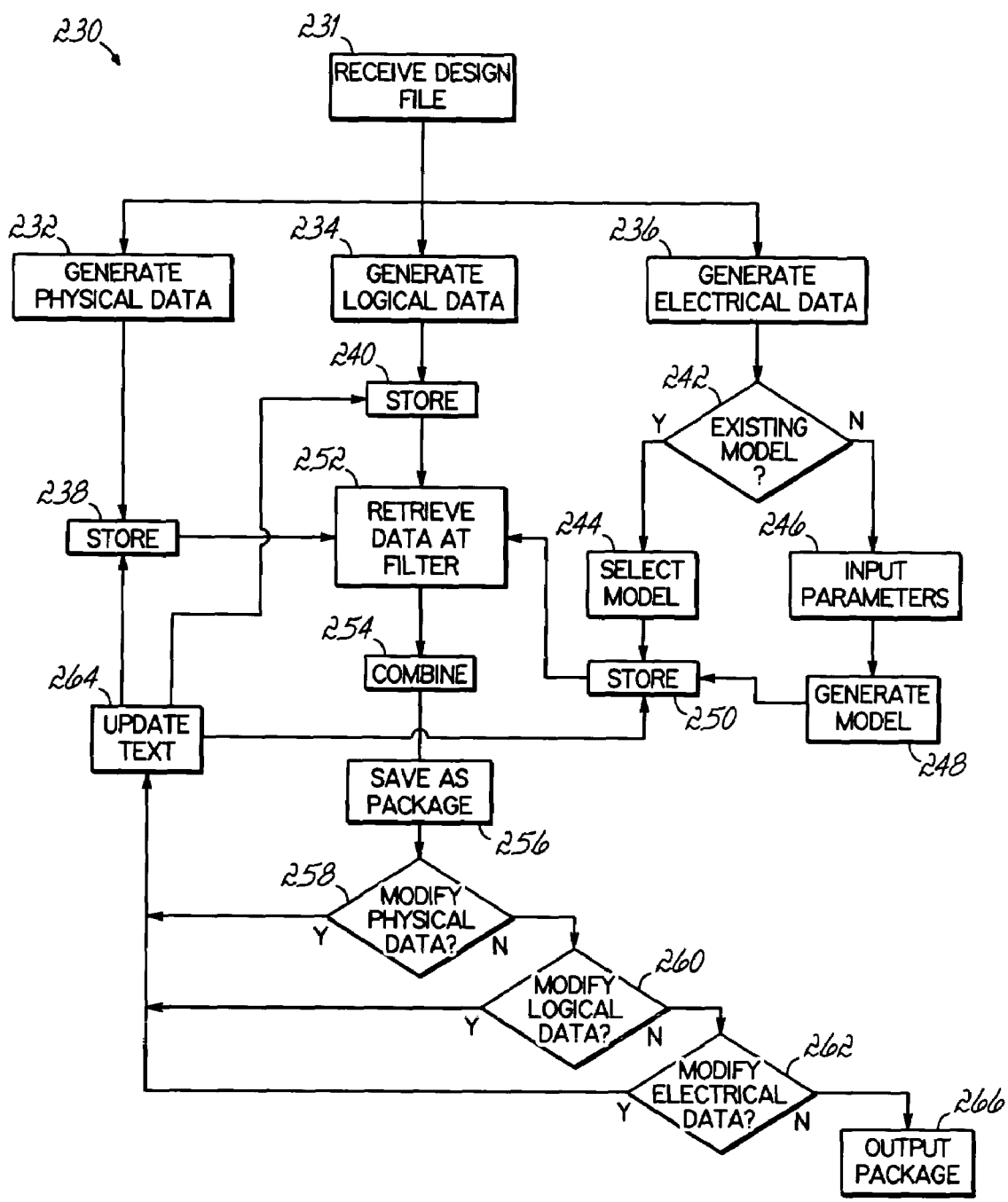
FIG. 5 is a flowchart having method steps consistent with the invention and having particular application within the context of the automatic package file generation processes of FIG. 4.

FIG. 5 shows steps 231–266 that relate to and expand upon the pre-processing and package generation step 202 of FIG. 4. More particularly, the exemplary method steps 231–266 of FIG. 5 are configured to automatically initiate generation of a package file configured for selective combination with other package files 44. The combined package files may comprise a net file 58 as described herein. A package file for purposes of an embodiment of the present invention may include a text file having data that relates to at least a portion of a electrical circuit 70 to be analyzed. Part of that analysis may include reception at block 231 of a comprehensive design file 46 that defines the electrical circuit 70. Namely, the design file 46 may comprise data detailing the construction specifications of the design, and is typically generated using a design tool 60, such as a CAD tool. The design file 46 may be retrieved from memory 29, generated at the client computer 12, and/or be transmitted from a remote source at block 231 of FIG. 5.

Program code 62 consistent with the invention may process the design file 46 to generate parseable data files for use in generating a package file 44. Such data files may include logical data 48, physical data 50 and electrical data 52. As shown in FIG. 5, the program code creates physical data 50 at block 232, logical data 48 at block 234 and electrical data 52 at block 236. Logical data 48 generally includes text describing relative component connectivity. For instance, an exemplary logical file may identify that an expansion card 78a couples to both a bus 82a and a microchip module 74a. Physical data 50 typically includes geometric coordinates describing the precise location of components within a design. Where applicable, such coordinates of the physical data 50 may have three dimensions to account for semiconductor layers.

Electrical data 52 regards electrical attributes associated with components, wiring or other portions of a design 70 designated for analysis. Such electrical attributes may include resistance, capacitance, inductance and/or dispersion loss characteristics progammatically associated with a designated component and/or section of the design 70. As such, electrical data 52 consistent with the invention may specify an appropriate semiconductor layer and/or type of a component. Designations of a component may be accomplished using either or both logical and physical nomenclature. For instance, an inductance value may be assigned to all components having a particular identification. The electrical parameters/characteristics, themselves, may be contained in an electrical model 45 stored separately from the electrical data 52. A suitable electrical model 45 may be invoked or otherwise referenced by pointers present in the electrical data 52. In this manner, parameters of the model 45 are automatically associated/imputed with specified components and/or design 70 portions during simulation.

As such, electrical data 52 may programmatically link to preexisting electrical models 45 having applicable electrical characteristics. As shown in FIG. 5, program code 62 consistent with the invention may determine if a model 45 having desired resistive and other electrical characteristics already exists at block 242. Where such an existing model 45 is located, the user or the program code 62 may select that model 45 at block 244 for assignment to a given package or portion of a package file. Alternatively, where a satisfactory, preexisting model 45 cannot be determined at block 242, then pertinent electrical parameters may be input by a user or retrieved from storage at block 246. Program code 62 may then process the input parameters to generate a new electrical model 45 at block 248 having the desired characteristics. In either case, the electrical data 52 may eventually be augmented by, initialize, point to, or otherwise include pertinent electrical model data 45 as selected or created at blocks 244 or 248, respectively.

As shown in FIG. 5, the physical, logical and electrical data 48–52 may be generated at blocks 232, 234 and 236, respectively. Generation for purposes of embodiments of the present invention may include sampling or otherwise extracting the data 48–52 from the design file 46. Generation may likewise include processing of the design file 46 in conjunction with user/stored input as accomplished by the program code 62. All of the data 48–52 is typically formatted for subsequent processing and storage at blocks 232–236. One of skill in the art will recognize that other types of data consistent with the invention may be alternatively or additionally generated. Moreover, it should be appreciated that the data may be stored in one or more files at blocks 238, 240 and 250. Some files may include more than one type of data 48–52 or redundant information where advantageous. In some contexts, however, separate storage of the data at blocks 238, 240 and 250 may facilitate more focused processing and modification. Separate storage may additionally preserve the integrity of unaffected and separately stored data. As discussed herein in greater detail, such a feature can further streamline design changes by allowing a user to immediately reuse unaffected data, without having to regenerate it.

Program code 64 consistent with the invention receives the stored physical, logical and electrical data 48–52 at block 252 of FIG. 5. For instance, the program code 64 may automatically extract data from preset fields of each stored datasource 48–52. Program code 64 consistent with another embodiment of the invention may sample all or only those data fields needed in a particular analysis and/or package generation session. The program code 64 may selectively sample from the stored data 48–52 according to predetermined package generation instructions. Such instruction may come from a system configuration file 57 and/or user input. Thus, program code 64 at block 252 embodies another flexible feature that can reduce unnecessary memory and processing requirements by filtering out superfluous data. Certain embodiment consistent with the invention may further abstract data in a sequence that tracks simulation requirements. Such a feature may allow certain simulation processes to begin while package data compiles.

At block 254 program code 64 may combine or otherwise process the data 48–52 sampled at block 252 to generate a package file 44. The resultant package file 44 may comprise a single text file having necessary logical, physical and/or electrical data. By virtue of its discrete size and its selective inclusion of all necessary data, the package file 44 at block 254 may present a manageable bundle of data that retains enough data to support an independent simulation. A suitable package file 44 of another environment may include just enough data to support a simulation when combined with other package files 44 containing complementary modeling, stitching or other simulation data. Of note, information contained within the package file 44 includes at least one reference connection. An exemplary reference connection will typically comprise a geometric coordinate, such as may be included within the physical data 50. For instance, a opportunistic reference connection includes a pin connection 73*a* used to interconnect components. One of skill in the art, however, will appreciate that other data, to include logical data 48, may further comprise suitable reference connections. The reference connection of each package file is configured to correlate to a respective reference connection of one or more other package files.

The package file 44 may be respectively stored and output at blocks 256 and 266 of FIG. 5. The stored package file 44 may be saved in connection with an identifier, such as a package name where advantageous. The package identifier may be useful in combining packages into a net file, for instance, by providing part of a pointer address for retrieval into the net file or an editing tool. Analogous to the individual storage of the data files 48–52 at blocks 238, 240 and 250, separate storage of each package file 44 preserves the integrity of the file 44 data. Individual storage at block 256 further facilitates net file 58 stitching as discussed below. For example, where the same package is used in multiple simulations, the package can be reused without requiring regeneration. Rather, only the package file(s) 44 or package file (stitched) configuration requiring change needs to be altered, preserving work achieved in the generation of other package files.

Where a given package file 44 does need to be altered for a given simulation, the flexible, structured processes of the present invention retain useful portions of the package file 44. For instance, a user may selectively access only those aspects of the package file 44 requiring modification. Blocks 258–262 of the embodiment of FIG. 5 show method steps suited to realize such versatility consistent with the present invention. More particularly, a user may desire at block 258 to change the physical data 50 of a package. Physical data 50 previously saved as part of the package file at block 256 may need to change for a subsequent simulation. Such a need may arise out of normal design optimization processes. For instance, the user may substitute, delete and/or add a component to a package file. Another user may reassign a given component to another package file in order to streamline a given simulation scenario. As such, the user may make the necessary change to the stored physical data 50 at blocks 264 and 258. Of note, the logical and electrical data 48, 52 of the package file as stored originally at blocks 240 and 250, respectively, may be reused with the updated physical data 50 at block 252.

Alternatively or additionally, the user may similarly modify existing logical and electrical data 48, 52 of the package file 44 at blocks 260–264. As such, the user may discretely make desired changes to respective portions of the text files without compromising data that the user wishes to remain unchanged. While the sequence of steps shown in FIG. 5 may be advantageous for a given application, one of skill in the art will appreciate that embodiments consistent with the present invention may alter the order of any of the steps of the flowchart of FIG. 5 or of those included herein. Moreover, a step may be added and/or deleted in accordance with the underlying principles of the present invention.

The steps of FIG. 5 may be accomplished for a plurality of package files as dictated by an applicable profile, net, simulation and/or design 70 configuration. The plurality of package files may be stored within the database 44 of FIG. 1 in such a manner as to be accessible by program code 42 consistent with the invention. As such, program code 42 may retrieve or otherwise receive package files at block 301 of FIG. 6. The flowchart of FIG. 6 further includes exemplary process steps 301–324 that further complement and/or comprise the model generation block 204 of FIG. 4.

Figure 6:
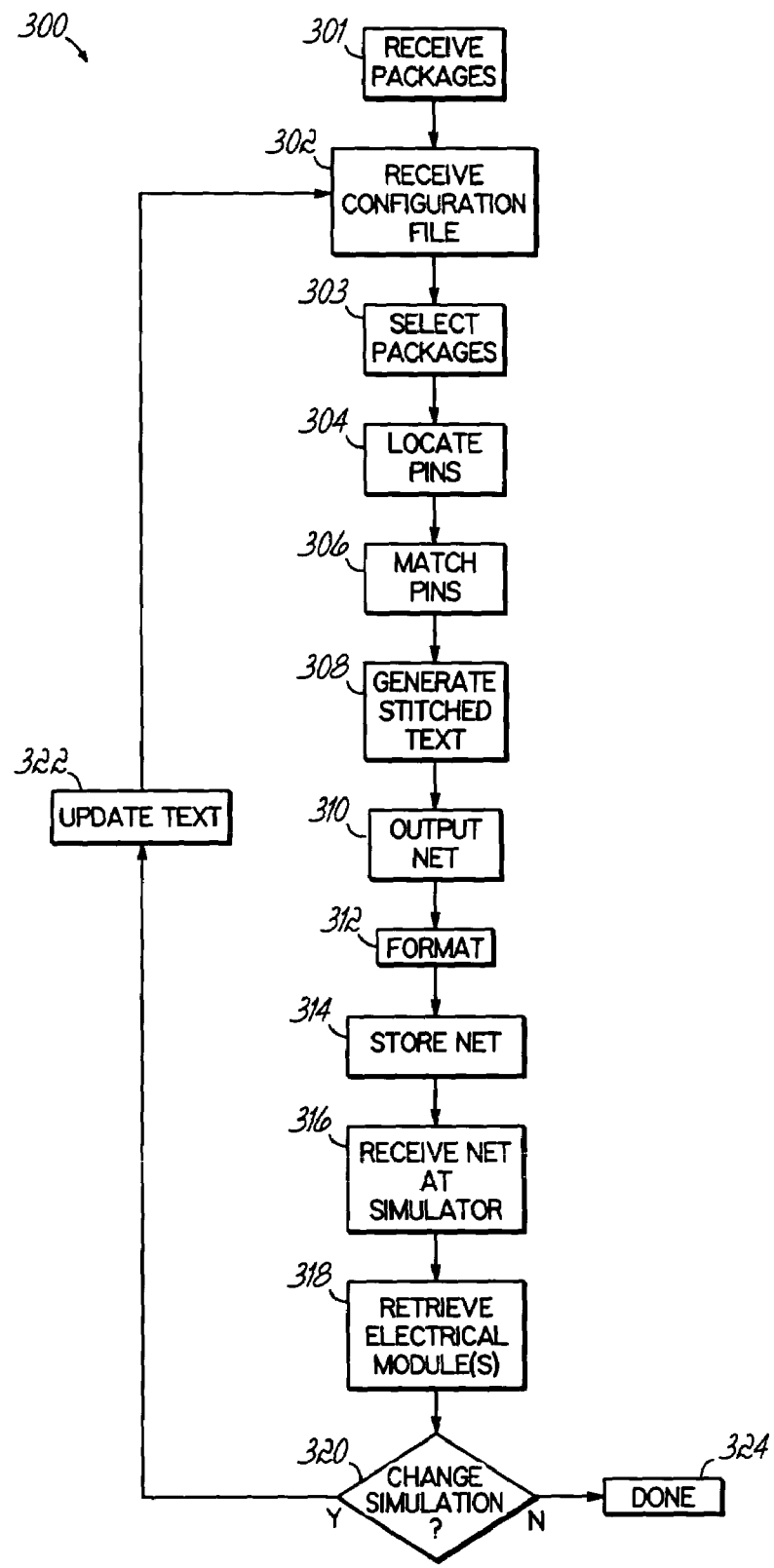
FIG. 6 is a flowchart having method steps consistent with the invention and having particular application within the context of the package/net file stitching and model creation processes of FIG. 4.

In the flowchart 300 of FIG. 6, each package file comprises a portion of a (net) design 70 to be analyzed. Each package file may further comprise independent logical, physical and electrical data 48–52, to include at least one reference connection as discussed herein. For processing considerations, package data as shown at block 301 may include only partially generated package files. That is, the system 10 may initially abstract only that data that is necessary to begin a simulation process. This feature may further streamline simulation processes that otherwise might be delayed.

A user may use a configuration file 57 formed as a function of a profile, for instance, to stipulate which of the package files are to be included within a given simulation/net. An exemplary configuration file 57 may include text having a programmatic instruction that directs program code 42 to selectively stitch packages. As such, the program code 42 may receive and process the configuration file 57 at block 302 of FIG. 6. The program code 42 may determine from the configuration file 57 which of and how the package files are to be connected to form a composite, net file.

The program code 42 then stitches designated package files together using connective points of each package file. For instance, the program code may link the package files using common connective pins. Pin matching assignments may be predetermined per the configuration file 57. Alternatively, the program code 42 may automatically match connective points for each package based on preset connection rules. Such rules may account for geographic vicinity of connective points, component type, component material or virutually any other discernable feature of respective package files.

By virtue of the prior generation and separate storage of each package file in the database 44, stitching is accomplished without having to re-accomplish package creation. Furthermore, changes to the configuration file 57 made at block 322 may readily substitute, add and/or delete existing package files as required for subsequent simulations.

More particularly, the system 10 may automatically retrieve those package files from a database 44 at block 303 that are designated within the profile and configuration file 57. Program code 42 of one embodiment consistent with the invention locates reference connections of each, retrieved package file at block 304. For instance, the program code 42 may scan each package file for connector pins 73a and 73b. In this manner, geometric coordinates for each connector pin 73a and 73b may be determined. As discussed herein, suitable reference connections may include other physical and/or logical information included within a package file.

The program code 42 may correlate the located reference connections at block 306. For example, the coordinates of the connector pins 73a and 73b of the above example may be matched according to user input and/or predetermined rules. Such rules may account for logical and/or physical data included within the configuration file 57 and/or program code 42, such as physical layering and logical connectivity. As such, a single reference connection may link multiple, different package files as necessary.

At block 308, the program code 42 may stitch the package files using the reference connections. For instance, the text of respective package files may be arranged and augmented with connective, linking text within a generated net file. The resultant net file may then be output at block 310 for subsequent formatting at block 312. One of skill in the art will appreciate that respective net files may be stitched using process steps similar to those described above in connection with stitching package files.

Net files may be stored at block 314 of FIG. 6 within a database 58 for future use. Where useful, program code 42 may format the stored net file according to modeling tool/simulator 68 specifications. Again, while the net file need not include text, a text file may lend particular application to smooth formatting and conversion during subsequent processing. In any case, the simulator 68 may receive the net file along with electrical models at blocks 316 and 318, respectively. Electrical models are typically determined from the data contained within the net file, or data otherwise derived from an input profile. As such, electrical models linked to text of the net file may be retrieved, sampled or otherwise applied at block 318. As discussed herein, the referenced electrical models impute resistance and dispersion loss characteristics to applicable portions of the net file.

Thus, the system 10 is in possession of or otherwise has access at block 318 to at least most of all the data and programs needed to conduct a given simulation. However, it is usually necessary for a user to run multiple simulations using varying net files in order to optimize a given design. Processes consistent with the present invention facilitate such analysis by allowing the user to make changes to the net file at blocks 320 and 322. Such changes may relate to package file configuration and other modeling parameters known by those of skill in the art. Where useful, textual changes may be made directly to the configuration file 57 at block 322. In this manner, a user may substitute, add and/or delete text from the net file as required for subsequent simulations. Other changes may be accomplished by specifying a new profile that is used to automatically generate a new configuration file as discussed above. In either case, new net files may be realized without having to re-accomplish other aspects of net file creation. New net files may be saved under new file names where desired.

While the present invention has been illustrated by a description of various embodiments, and while these embodiments have been described in considerable detail, it is not the intention of the applicants to restrict or in any way limit the scope of the appended claims to such detail. For instance, while the exemplary sequence of steps shown in FIGS. 3–6 may have particular utility in certain contexts, it should be understood that the order of such steps may be rearranged and/or modified to suit different design requirements. Additional advantages and modifications will readily appear to those skilled in the art. For instance, while embodiments of the present invention analyze noise and timing parameters with particular effectiveness, one of skill in the art will appreciate that other design performance parameters may be analyzed using methods that are consistent with the underlying principles of the present invention. Moreover, any of the programs, file or other resources shown in FIG. 1 may be redistributed between local and remote computers per application specifications. Thus, the invention in its broader aspects is therefore not limited to the specific details, representative apparatus and method, and illustrative example shown and described. Accordingly, departures may be made from such details without departing from the spirit or scope of the applicants' general inventive concept.

The invention claimed is:

1. A method for managing a simulation involving an electrical design, comprising:

receiving a modeling application for modeling the electrical design that includes a plurality of package files, wherein each package file is descriptive of an electrical performance attribute comprising at least one electrical property selected from a group consisting of resistance, capacitance, inductance, voltage, routing information and dispersion losses of electrical signal strength, the electrical performance attribute being associated with a plurality of components of the electrical design and defines a reference connection;

automatically linking first and second package files of the plurality of package files by correlating respective reference connections of each of the first and second package files; and automatically executing using a computer readable medium a simulation using the modeling application to determine a performance characteristic of the electrical design.

2. The method of claim 1, wherein executing the simulation further includes automatically monitoring for a status of the simulation.

3. The method of claim 2, further comprising automatically initiating a remedial action in response to the status.

4. The method of claim 1, wherein executing the simulation further includes coordinating submission of the modeling application for processing.

5. The method of claim 1, wherein executing the simulation further includes conducting a pre-run check.

6. The method of claim 5, further comprising automatically performing a remedial action in response determining an error using the pre-run check.

7. The method of claim 1, further comprising automatically maintaining a log file.

8. The method of claim 1, further comprising interrupting at least a portion of the simulation in response to input.

9. The method of claim 8, further comprising saving a state of the portion.

10. The method of claim 1, further comprising automatically assembling output of the simulation.

11. The method of claim 1, wherein linking the package files includes selectively linking the package files according to a profile.

12. The method of claim 11, further comprising automatically generating the profile in response to input.

13. The method of claim 1, further comprising automatically outputting a report.

14. The method of claim 1, further comprising initiating post processes in response to the simulation ending.

15. An apparatus, comprising:
a memory;
a database resident in the memory, the database storing a plurality of package files that comprise a modeling application, each package file of the plurality of package files being descriptive of an electrical performance attribute comprising at least one electrical property selected from a group consisting of resistance, capacitance, inductance, voltage, routing information and dispersion losses of electrical signal strength, the electrical performance attribute being associated with a plurality of components of an electrical design and having a reference connection correlating to a respective reference connection of another package file of the plurality; and
a program stored on a computer readable medium and configured for selectively stitching first and second package files of the plurality of package files by correlating the respective reference connections of the first and second package files; the program being further configured to execute a simulation using the modeling application to determine a performance characteristic of the electrical design.

16. The apparatus of claim 15, wherein the program initiates monitoring for a status of the simulation.

17. The apparatus of claim 16, wherein the program initiates a remedial action in response to the status.

18. The apparatus of claim 15, wherein the program initiates coordinating the submission of the modeling application for processing.

19. The apparatus of claim 15, wherein the program initiates a pre-run check.

20. The apparatus of claim 19, wherein the program initiates a remedial action in response to determining an error using the pre-run check.

21. The apparatus of claim 20, wherein the program initiates selectively and logically linking the net file with another net file.

22. The apparatus of claim 15, wherein the program maintains a log file.

23. The apparatus of claim 15, wherein the program initiates interrupting at least a portion of the simulation in response to input.

24. The apparatus of claim 23, wherein the program initiates saving a state of the portion.

25. The apparatus of claim 15, wherein the program initiates assembling output of the simulation.

26. The apparatus of claim 15, wherein the program initiates selective linking of the package files according to a profile.

27. The apparatus of claim 26, wherein the profile is generated in response to input.

28. The apparatus of claim 15, wherein the program initiates generating an output selected from a group consisting of at least one of: an analog waveform, noise data and timing data.

29. The apparatus of claim 15, wherein the program initiates post processes.

30. A program product, comprising:
a program stored on a computer readable medium and configured to manage a simulation involving an electrical design by selectively stitching first and second package files of a plurality of package files that comprise a part of a modeling application, wherein each package file is descriptive of an electrical performance attribute comprising at least one electrical property selected from a group consisting of resistance, capacitance, inductance, voltage, routing information and dispersion losses of electrical signal strength, the electrical performance attribute being associated with a plurality of components of the electrical design; the program being further configured to execute a simulation using the modeling application to determine a performance characteristic of the electrical design.

* * * * *